US007034570B2

(12) United States Patent
McClintock et al.

(10) Patent No.: US 7,034,570 B2
(45) Date of Patent: Apr. 25, 2006

(54) I/O CELL CONFIGURATION FOR MULTIPLE I/O STANDARDS

(75) Inventors: Cameron McClintock, Mountain View, CA (US); Richard G. Cliff, Milpitas, CA (US); Bonnie I. Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/004,664

(22) Filed: Dec. 3, 2004

(65) Prior Publication Data

US 2005/0151564 A1 Jul. 14, 2005

Related U.S. Application Data

(60) Continuation of application No. 10/781,334, filed on Feb. 17, 2004, now Pat. No. 6,836,151, which is a division of application No. 09/898,183, filed on Jul. 3, 2001, now Pat. No. 6,714,050, which is a division of application No. 09/535,064, filed on Mar. 23, 2000, now Pat. No. 6,271,679.

(60) Provisional application No. 60/126,235, filed on Mar. 24, 1999.

(51) Int. Cl.
*H03K 19/177* (2006.01)

(52) U.S. Cl. .......................... 326/38; 326/82

(58) Field of Classification Search ............ 326/37–41, 326/80–90
See application file for complete search history.

(56) References Cited

U.S. PATENT DOCUMENTS 4,032,800 A 6/1977 Droscher et al.
4,469,959 A 9/1984 Luke et al.
4,472,647 A 9/1984 Allgood et al.
4,527,079 A 7/1985 Thompson
4,625,129 A 11/1986 Ueno
4,742,252 A 5/1988 Agrawal
4,783,607 A 11/1988 Hsieh
4,791,312 A 12/1988 Weick
4,797,583 A 1/1989 Ueno et al.
4,820,937 A 4/1989 Hsieh
4,879,481 A 11/1989 Pathak et al.
4,933,577 A 6/1990 Wong et al.
4,970,410 A 11/1990 Matsushita et al.
4,975,602 A 12/1990 Nhu (Continued)

FOREIGN PATENT DOCUMENTS

EP 0 358 501 3/1990

(Continued)

OTHER PUBLICATIONS

Altera Corporation, Data Sheet, "Flex 10K Embedded Progrmmable Logic Family," Jul., 1995, ver. 1, pp. 1-39.

(Continued)

*Primary Examiner*—Don Le
(74) *Attorney, Agent, or Firm*—Townsend and Townsend and Crew LLP

(57) ABSTRACT

Circuitry is provided to individually configure each I/O of an integrated circuit to be compatible with a different LVTTL I/O standards. This can be done with only one I/O supply voltage, where that voltage is the highest of the I/O voltages needed in a particular application. The circuitry operates by regulating the output voltage of the I/O cell so that it is above the VOH and below the maximum VIH for the LVTTL standard for which it will comply with. Since each I/O cell is individually configurable, any I/O can drive out to any LVTTL specification.

18 Claims, 8 Drawing Sheets

U.S. PATENT DOCUMENTS

| | | | |
|---|---|---|---|
| 4,987,319 | A | 1/1991 | Kawana |
| 4,994,691 | A | 2/1991 | Naghshineh |
| 4,999,529 | A | 3/1991 | Morgan, Jr. et al. |
| 5,023,488 | A | 6/1991 | Gunning |
| 5,028,821 | A | 7/1991 | Kaplinsky |
| 5,034,634 | A | 7/1991 | Yamamoto |
| 5,132,573 | A | 7/1992 | Tsuru et al. |
| 5,151,619 | A | 9/1992 | Austin et al. |
| 5,235,219 | A | 8/1993 | Cooperman et al. |
| 5,282,271 | A | 1/1994 | Hsieh et al. |
| 5,300,835 | A | 4/1994 | Assar et al. |
| 5,311,080 | A | 5/1994 | Britton et al. |
| 5,317,210 | A | 5/1994 | Patel |
| 5,331,220 | A | 7/1994 | Pierce et al. |
| 5,332,935 | A | 7/1994 | Shyu |
| 5,369,317 | A | 11/1994 | Casper et al. |
| RE34,808 | E | 12/1994 | Hsieh |
| 5,374,858 | A | 12/1994 | Elmer |
| 5,428,305 | A | 6/1995 | Wong et al. |
| 5,428,800 | A | 6/1995 | Hsieh et al. |
| 5,440,249 | A | 8/1995 | Schucker et al. |
| 5,521,530 | A | 5/1996 | Yao et al. |
| 5,534,794 | A | 7/1996 | Moreland |
| 5,534,798 | A | 7/1996 | Phillips et al. |
| 5,583,454 | A | 12/1996 | Hawkins et al. |
| 5,589,783 | A | 12/1996 | McClure |
| 5,606,275 | A | 2/1997 | Farahang et al. |
| 5,612,637 | A | 3/1997 | Shay et al. |
| 5,689,460 | A | 11/1997 | Ooishi et al. |
| 5,798,659 | A | 8/1998 | Shay et al. |
| 5,815,013 | A | 9/1998 | Johnston |
| 5,880,624 | A | 3/1999 | Koyanagi et al. |
| 5,974,476 | A | 10/1999 | Lin et al. |
| 6,018,252 | A | 1/2000 | Imaizumi |
| 6,404,712 | B1 | 3/2000 | Mejia |
| 6,049,227 | A | 4/2000 | Goetting et al. |
| 6,163,180 | A | 12/2000 | Hidaka et al. |
| 6,229,365 | B1 | 5/2001 | Iketani et al. |
| 6,271,679 | B1 * | 8/2001 | McClintock et al. ......... 326/38 |
| 6,271,879 | B1 | 8/2001 | McClintock et al. |
| 6,335,637 | B1 | 1/2002 | Correale, Jr. et al. |
| 6,714,050 | B1 | 3/2004 | McClintock et al. |
| 6,836,151 | B1 | 12/2004 | McClintock et al. |

FOREIGN PATENT DOCUMENTS

| | | |
|---|---|---|
| EP | 0 544 461 | 2/1993 |
| EP | 0 608 515 | 3/1994 |
| EP | 0 616 431 | 9/1994 |
| EP | 0718977 | 6/1996 |
| EP | 0750242 | 12/1996 |
| EP | 0 426 283 | 12/1997 |
| JP | 01-274512 | 11/1989 |
| JP | 02-013124 | 1/1990 |
| JP | 02-161820 | 6/1990 |
| JP | 04-223617 | 8/1992 |
| WO | WO 98/47230 | 10/1998 |

OTHER PUBLICATIONS

Altera Corporation, Data Sheet, "Apex 20K", May, 1999, pp. 23-88.

Chappell et al. "Fast CMOS ECL Receivers With 100-mV Worst-Case Sensitivity,"*IEEE Journal of Solid-State Circuits*, vol. 23, No. 1, Feb. 1988, pp. 59-66.

Claude "Cross-boundary PLDs," *Semiconductor Currents*, Jun., 1991, pp. 9-10.

Guardiani et al. "Applying a submicron mismatch model to practical IC design," *IEEE 1994 Custom Integrated Circuits Conference*, 1994, pp. 297-300.

Gunning et al., "A CMOS Low-Voltage-Swing Transmission-Line Transceiver," *IEEE International Solid-State Circuits Conference*, 1992, pp. 58-59.

Haines "Field-programmable gate array with non-volitile configuration," *Microprocessors and Microsystems*, vol. 13, No. 5, Jun. 1989, pp. 305-312.

Hanafi et al. "Design and Characterization of CMOS Off-Chip Driver/Receiver with Reduced Power-Supply Disturbance," *IEEE Journal of Solid-State Circuits*, vol. 27, No. 5, May 1992, pp. 783-785.

Martinez "IEEE 1194.1 BTL-Enabling Technology for High Speed Bus Applications," National Semiconductor Application Note 829, Jun. 1992, pp. 1-5.

Knack "Debunking High-Speed PCB Design Myths," *ASIC & EDA*, Jul. 1993, pp. 12-26.

Pelgrom et al. "A 3/5 V Compatible I/O Buffer," *IEEE Journal of Solid-State Circuits*, vol. 30, No. 7, Jul. 1995, pp. 823-825.

Pelgrom et al. "Matching Properties of MOS Transistors," *IEEE Journal of Solid-State Circuits*, vol. 24, No. 5, Oct. 1989, pp. 1433-1440.

Prince et al. "ICs going on a 3-V diet," *IEEE Spectrum*, May 1992, pp. 23-25.

Roberts et al. "Session XIX: High Density SRAMs," *IEEE International Solid-State Circuits Conference*, Feb. 27, 1987, pp.252-254.

Senthinathan et al., "Application Specific CMOS Output Driver Circuit Design Techniques to Reduce Simultaneous Switching Noise," *IEEE Journal of Solid-State Circuits*, vol. 28, No. 12, Dec. 1993, pp. 1383-1388.

Senthinathan et al., "Simultaneous Switching Ground Noise Calculation for Packaged CMOS Devices," *IEEE Journal of Solid-State Circuits*, vol. 26, No. 11, Nov. 1991, pp. 1724-1728.

Ueda et al. "A 3.3V ASIC for Mixed Voltage Applications With Shut Down Mode," *IEEE 1993 Custom Integrated Circuits Conference*, May 9-12, 1993, pp. 25.5.1 to 25.5.4.

Voldman "ESD Protections ina Mixed Voltage Interface and Multi-Rail Disconnected Power Grid Environment in 0.50- and 0.25-µm Channel Length CMOS Technologies," *EOS/ESD Symposium*, 1994, PP. 3.4.1 to 3.4.10.

Vu et al. "A Gallium Arsenide SDFL Gate Array with On-Chip RAM," *IEEE Journal of Solid-State Circuits*, vol. sc-19, No. 1, Feb. 1984, pp. 10-22.

Williams "Mixing 3-V and 5-V ICs," *IEEE Spectrum*, Mar. 1993, pp. 40-42.

"Virtex 2.5 V Field Programmable Gate Arrays"; XILINX, Nov. 1998, 20 pages.

* cited by examiner

I/O CELL CONFIGURATION FOR MULTIPLE I/O STANDARDS

This application is a continuation application of U.S. application Ser. No. 10/781,334 filed Feb. 17, 2004 now U.S. Pat. No. 6,836,151, which is a divisional of U.S. application Ser. No. 09/898,183 filed Jul. 3, 2001, U.S. Pat. No. 6,714,050, which is a divisional of U.S. application Ser. No. 09/535,064 filed Mar. 23, 2000, U.S. Pat. No. 6,271,679, which claims the benefit of U.S. provisional application No. 60/126,235, filed Mar. 24, 1999, all of which are incorporated by reference along with all references cited in this application.

BACKGROUND

The present invention relates to the field of integrated circuits and more specifically, to output buffer circuitry capable of operating at the output voltage levels needed for a particular application.

As semiconductor processing technology continues to advance, integrated circuits or "chips" continue to provide greater functionality and performance. Examples of some integrated circuits include microprocessors, application specific integrated circuits (ASICs), programmable logic devices (PLDs), field programmable gate arrays (FPGAs), and memories such as dynamic random access memories (DRAMs), static random access memories (SRAMs), and nonvolatile memories (Flash and EEPROM). The positive power supply voltage used for integrated circuits of different process technologies is often different. Generally, newer process technologies use reduced positive power supply voltages. For example, previous generation integrated circuit used a supply voltage, VDD or VCC, or 5 volts. More recent integrated circuits used 3.3- and 3-volt power supplies. Some current integrated circuits use 2.5-volt power supplies. In the future, it is expected supply voltages will be further reduced to 2 volts and lower. Some of the expected power supply voltages will be 1.2 volts, 1 volt, and 0.8 volts. Therefore, each generation of integrated circuits is compatible with a particular power supply voltage and input and output standard.

In an electronic system, it is often desirable that an integrated circuit compatible with one input-output standard can be used with integrated circuits of other input-output standards. Among the many advantages of having such a chip, the integrated circuit customer can used that particular chip on a system board with chips of other input-output standards. The integrated circuit manufacturer can produce one chip that is compatible with current and previous generation technology.

Furthermore, when there are emerging I/O standards for integrated circuits such as for a low voltage TTL (LVTTL) output or low voltage differential signal (LVDS) output, the different standards often have different voltages for VOH and VOL. Until a uniform standard is adapted, it is desirable for integrated circuit makers to design their products to be compatible with as many of the standards as possible. This will increase the overall potential market for a particular product.

Therefore, there is a need for an output circuitry that is adaptable or configurable to different I/O standards.

SUMMARY

The present invention provides circuitry to individually configure each I/O of an integrated circuit to different LVTTL I/O standards. This is done with only one I/O supply voltage, where that voltage is the highest of the I/O voltages needed in a particular application. The invention operates by regulating the output voltage of the I/O cell so that it is above the VOH and below the maximum VIH for the LVTTL standard for which it will comply with. Since each I/O cell is individually configurable, any I/O can drive out to any LVTTL specification.

In an embodiment, the present invention is a programmable logic integrated circuit including a group of first I/O circuits connected to a supply voltage and a first configurable reference voltage. There is also a group of second I/O circuits connected to the supply voltage and a second configurable reference voltage. The first configurable reference voltage is different from the second configurable reference voltage. The group of first I/O circuits is compatible with a first I/O voltage standard based on the first configurable reference voltage and the group of second I/O circuits compatible with a second I/O voltage standard based on the second configurable reference voltage.

Other objects, features, and advantages of the present invention will become apparent upon consideration of the following detailed description and the accompanying drawings, in which like reference designations represent like features throughout the figures.

DESCRIPTION OF EXEMPLARY EMBODIMENTS

Figure 1:
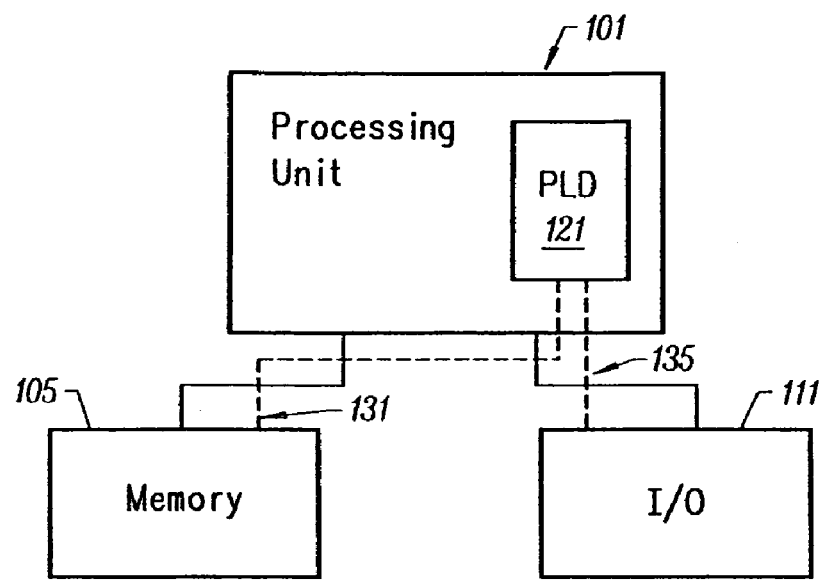
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258,668, 5,260,610, 5,260,611, 5,436,575, and the *Altera Data Book* (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
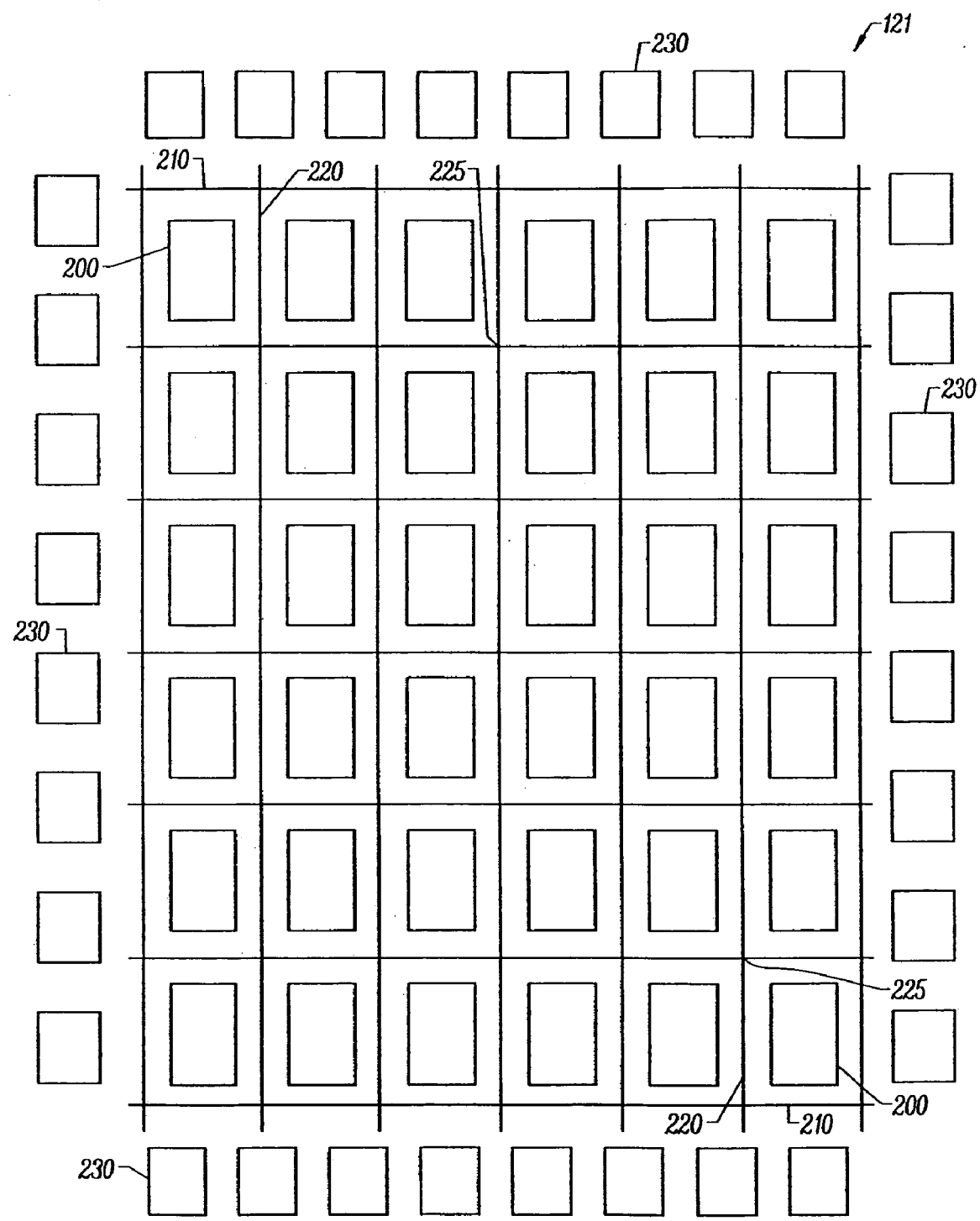
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 3:
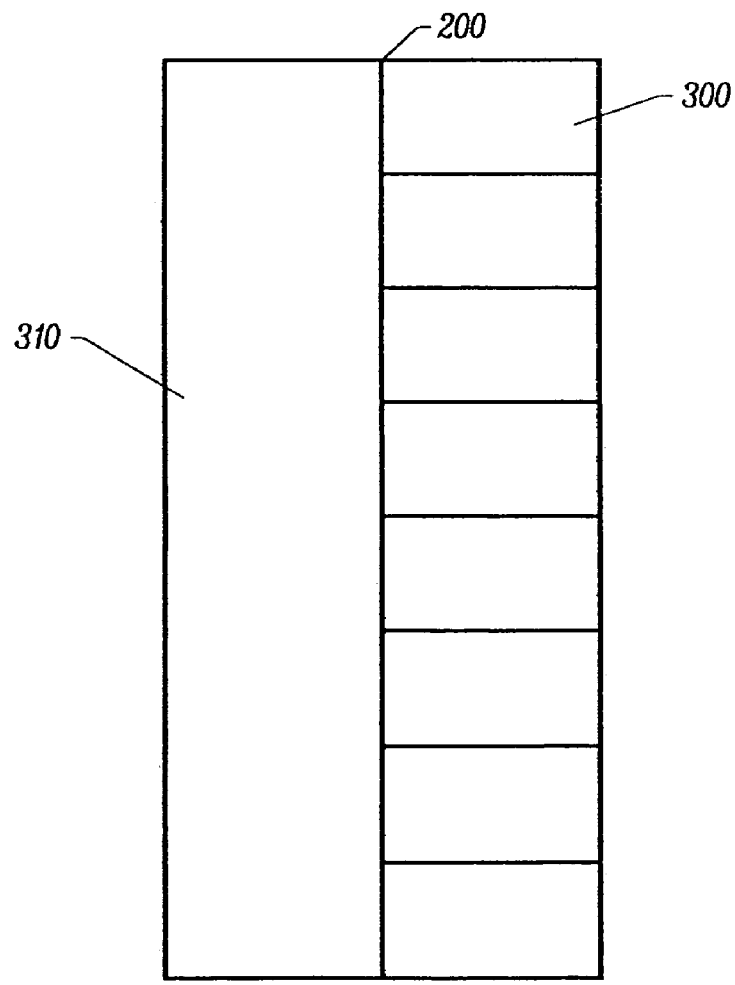
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
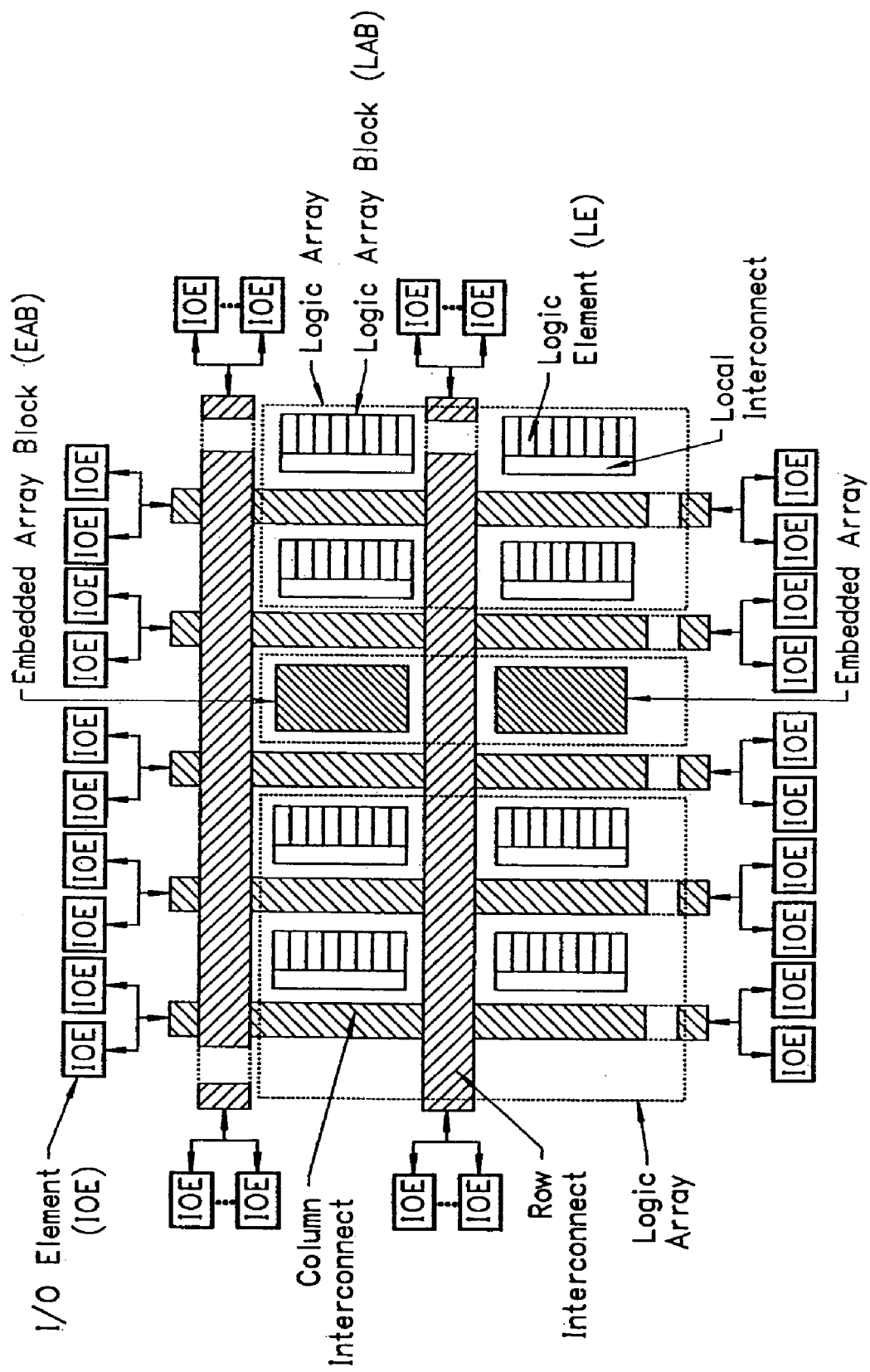
FIG. 4 shows an architecture of a programmable logic integrated circuit with embedded array blocks (EABs)

FIG. 4 shows a PLD architecture similar to that in FIG. 2. The architecture in FIG. 4 further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550,782, which are incorporated by reference.

Figure 5:
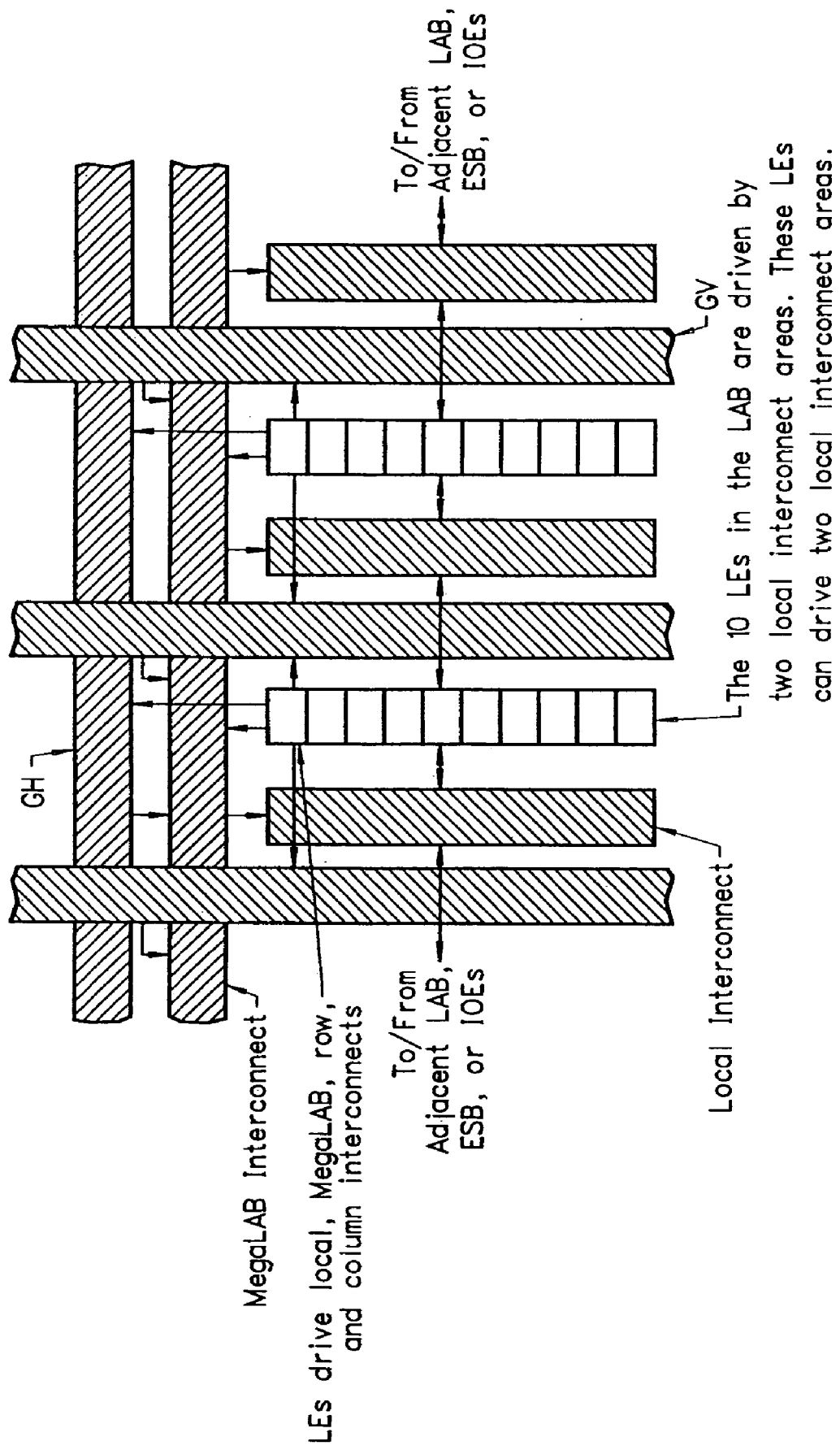
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the *APEX 20 K Programmable Logic Device Family Data Sheet* (August 1999), which is incorporated by reference. In a specific implementation, a megaLAB also includes an embedded system block (ESB) to implement a variety of memory functions such as CAM, RAM, dual-port RAM, ROM, and FIFO functions.

VCC voltages for integrated circuits continue to change and generally are being reduced. Some VCC voltages today are 5 volts, 3.3 volts, 2.5 volts, and 1.8 volts. For each of these VCC, there is also an accompanying specification for VOH and other I/O parameters. For some integrated circuits, one group of I/O pins may be used to support a particular VCC and VOH standard while another group supports another standard. For example, some I/O pins may be used for the 5-volt standards while other I/O pins are for use with the 3.3-volt standard. It is important that the output buffer circuitry is adaptable to facilitate compatibility with multiple and changing standards. One technique to implement multiple standards is to use different VCCs for different I/O pins. However, this technique requires separate I/O buffers for each standard, which will take more integrated circuit area.

Figure 6:
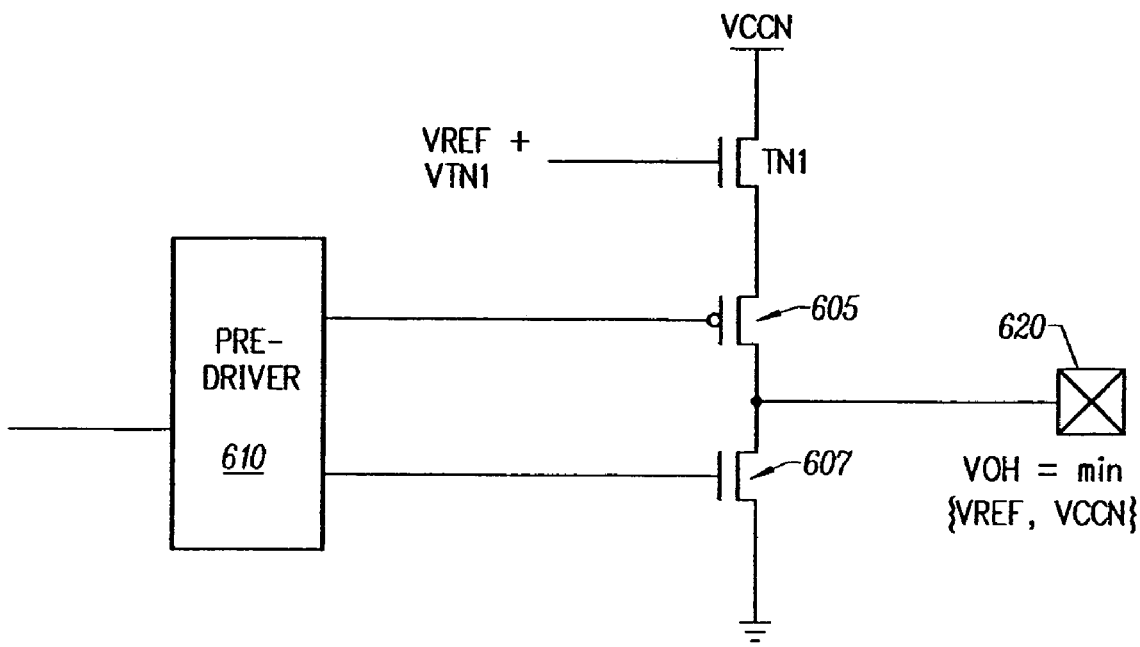
FIG. 6 shows a first circuit implementation of output buffer circuitry configurable to multiple I/O standards.
Figure 7:
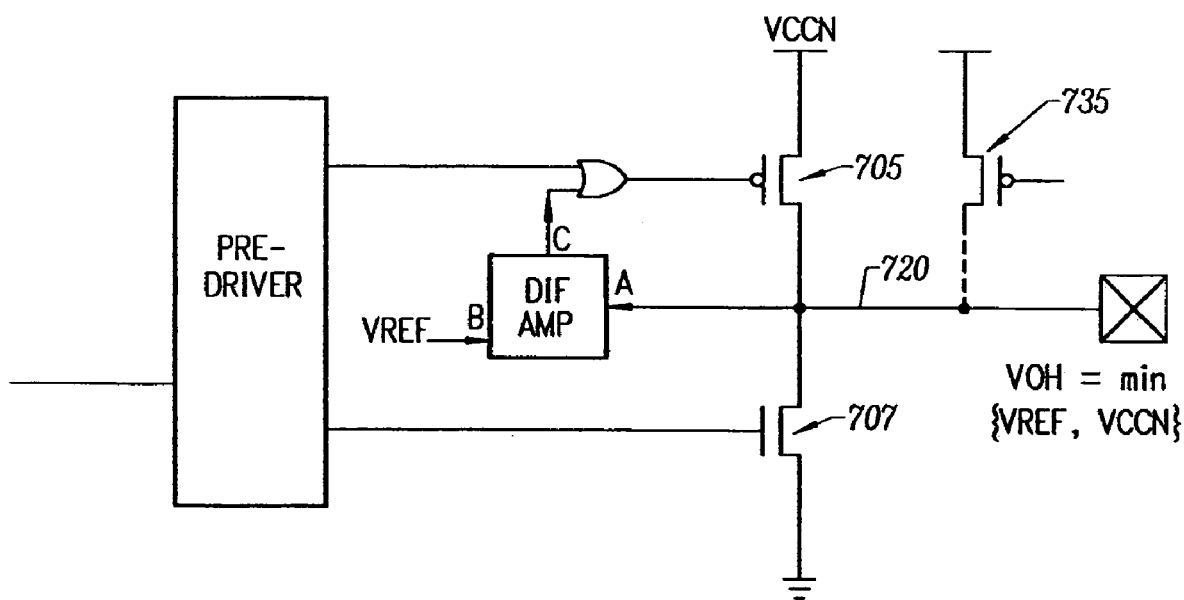
FIG. 7 shows a second circuit implementation of output buffer circuitry configurable to multiple I/O standards.

Another technique is to use a single VCC voltage and to configure the circuitry to provide a desired voltage output high (VOH) voltage to support a particular standard. FIGS. 6 and 7 show two implementations of output buffer circuitry to provide a configurable VOH voltage. By providing a configurable VOH voltage, this reduces the amount of integrated circuit area used because separate buffers for each of the different VCCs is no longer needed. The circuits shown in FIGS. 6 and 7 may be used to implement the configurable I/O cell of a programmable logic device. The I/O buffers in FIGS. 6 and 7 are simplified to better illustrate of the principles of the present invention. The techniques of these two circuits can also be combined into a single circuit to benefit from each implementation's strengths.

A VREF voltage is shown in the FIGS. 6 and 7. This VREF voltage may be generated internally within the integrated circuit. Or, VREF may be supplied from an external source. For example, the VREF may be generated from the supply voltage of the destination integrated circuit the I/O buffer will be driving. The VREF may be provided by an external VREF generator. There will be a VREF voltage for each LVTTL I/O standard supported. For example, different I/O pins of the same integrated circuit may support multiple LVTTL I/O standards. The particular I/O pin will be connected to the appropriate VREF voltage. Also, the VREF voltage may be generated using a programmable VREF generator. By programming the VREF generator appropriately, an I/O can be set to conform to a desired LVTTL I/O standard.

There is also the likelihood the LVTTL specifications for emerging supply voltage standards will be defined in the future with lower VOH and VIH max values than used presently. The technique of the present invention will allow the integrated circuit to adapt to these yet undefined and unavailable standards. If the VREF comes from an external source such as generated based on the destination integrated circuit, new LVTTL standards can be immediately supported with existing integrated circuit's containing this invention by applying the new supply voltage of the destination device to the invention integrated circuit's VREF.

If the VREF is generated on-chip, the VREF generated can be made programmable with enough gradations in settings so new LVTTL standards can be supported. The VREF generator is programmed to generate a VREF voltage level to set the VOH to meet the new standard. This is particularly easy to implement in programmable logic integrated circuits (e.g., FPGAs, PLDs, memories, EPROMs, EEPROMs, Flash EEPROMs) since these devices are programmed before use. Therefore, programming of these devices is already part of their use.

In the FIG. 6 embodiment, the output drivers are a PMOS transistor 605 and NMOS transistor 607. These transistors are driven by a predriver circuit 610. Transistor 605 is connected to VCCN through a NMOS transistor TN1. VCCN is a noisy VCC. VCCN is used in a integrated circuit implementation where there is a VCCQ or quiet VCC for internal circuitry and VCCN for the I/O circuitry. By providing separate VCCQ and VCCN pins, this helps isolate noisy circuitry from the circuitry that may be sensitive to power supply noise. Other integrated circuit implementation may only have a VCC pin for both noisy and quiet circuitry.

Predriver circuit drives transistors 605 and 607 to cause output node 620 to be high, low, or tristate. A gate of transistor TN1 is supplied with a voltage VREF+VTN1, where VTN1 is the threshold voltage of the TN1 device. Consequently, if VREF is less than VCCN, the source of transistor 605 will be at about VREF. If VCCN is less than VREF, then the source of transistor 605 will be about VCCN. Therefore, the VOH voltage at an output node 620 will be the lesser of either VREF or VCCN.

In order to obtain good transient characteristics, transistor TN1 should be quite large. TNI should be larger or very much larger than PMOS transistor 605. For example, in one implementation, transistor TN1 is at least about ten times larger in size than PMOS transistor 605. One reason why a relatively large TN1 is needed is because the TN1 device is likely to be barely on. A larger-sized device will supply greater current, especially when the device is not fully on.

The implementation in FIG. 7 is a technique to obtain a configurable VOH circuit without using the TN 1 transistor of the FIG. 6 circuit. In the FIG. 7 embodiment, there are output drivers PMOS transistor 705 and NMOS transistor 707, which are connected in series between VCCN and ground. An output 720 is taken from between transistors 705 and 707. An A input of a differential amplifier 205 is connected to an output node 720. And, a B input of differential amplifier 205 is connected to a VREF voltage. An output C of the differential amplifier is connected to a logic gate 230. In this implementation, logic gate 230 is an OR gate. However, other types of logic gates may be used to implement a similar function. For example, pass transistors may be used instead. The differential amplifier will output a logic level of 1 if a voltage at A is greater than a voltage at B and a 0 otherwise. Therefore, the VOH voltage at output node 220 will be the lesser of either VREF or VCCN.

FIG. 7 may optionally include a leaker device 735 to maintain VOH statically. The leaker device would be a relatively small-sized transistor to ensure the output high voltage is above the VOH required for input by another integrated circuit. The control electrode or gate of the leaker device may be connected to a reference voltage or VCCN. The reference voltage for the leaker device can be an internally generated voltage level. PMOS transistor 705 by itself will "dynamically" hold the pad at VOH. If the voltage of the pad drops slightly below VOH, PMOS 705 transistor will turn on to pull the pad up to VOH. However, with PMOS transistor 705 alone, the pad may exhibit some fluctuations as transistor 705 turns on and off. When transistor 705 is used in combination with leaker device 735, leaker device 735 tends to stabilize the voltage at the pad and dampen fluctuations.

Figure 8:
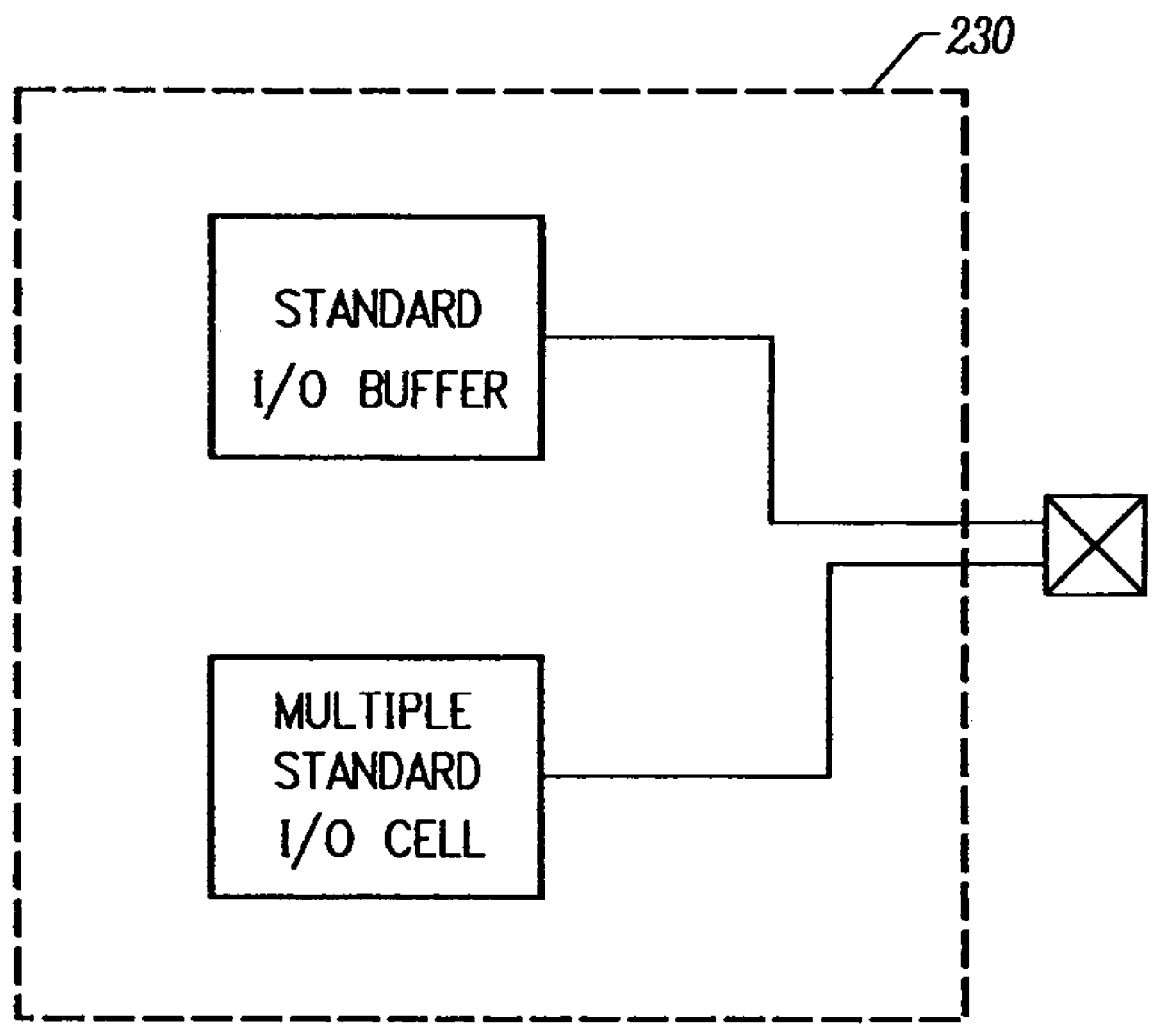
FIG. 8 shows a I/O configuration circuit including a standard I/O buffer circuit and a multiple standard I/O buffer circuit.

For the highest performance when using the FIG. 7 embodiment, a standard I/O cell can be placed in parallel with the FIG. 7 circuitry at output node 720. The standard I/O cell would provide standard VCCN support while the circuitry in FIG. 7 would provide support for multiple I/O standards. FIG. 8 is a block diagram of such an implementation. I/O circuit 230 includes both a standard I/O cell and multiple standard I/O circuit. The multiple standard circuit may include the circuitry shown in FIG. 6 or 7, or both, as well as other circuit technique to implement an multiple I/O standard output circuit.

Figure 9:
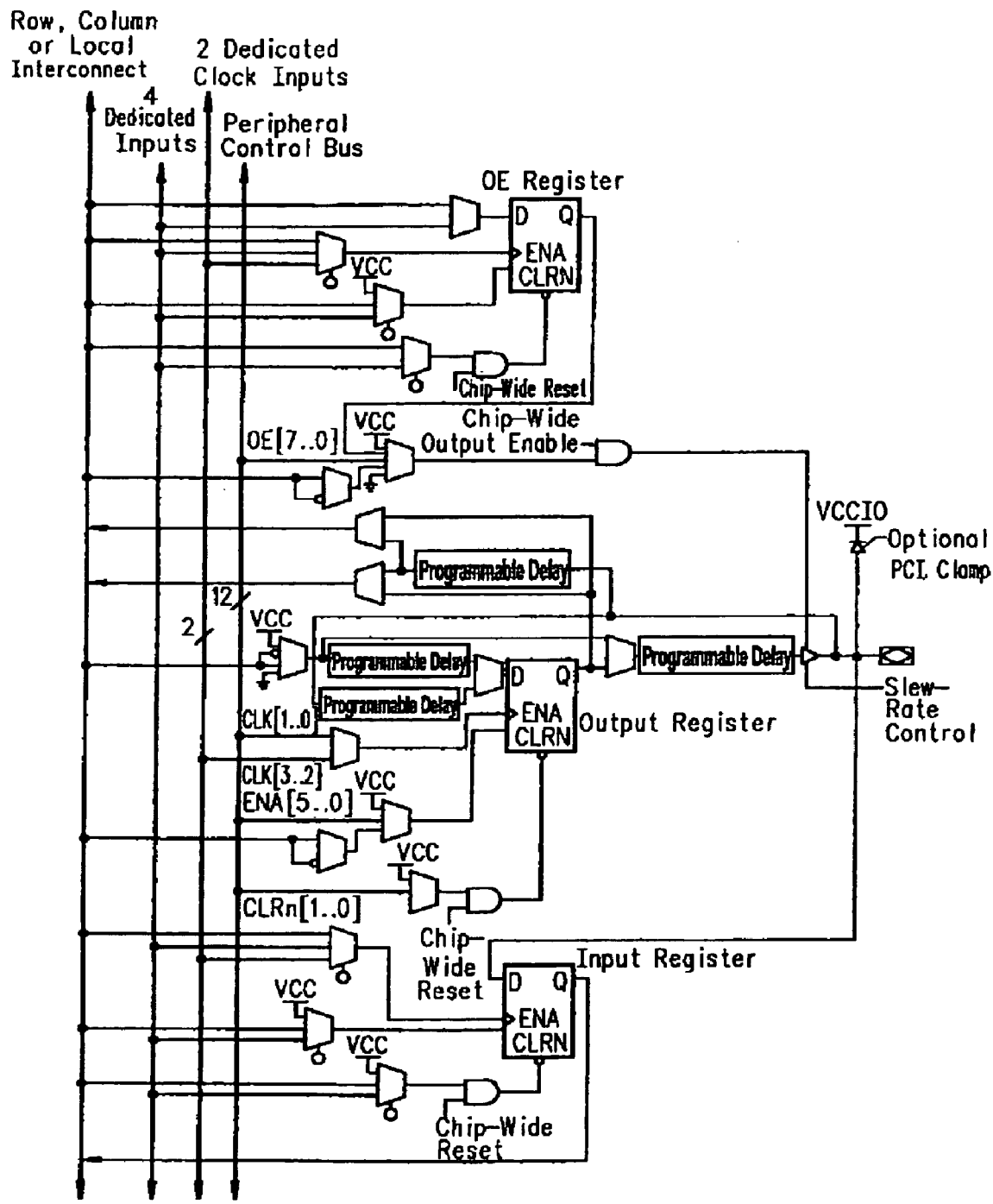
FIG. 9 shows an implementation of an I/O buffer circuit.

FIG. 9 shows a specific implementation of a standard I/O cell. This implementation is especially designed for use in a programmable logic device because of the flexible logic, but may also be used in other types of integrated circuits. For example, the configurable I/O circuit of the present invention may be used as the output buffer circuit between the output register and the pad.

Figure 10:
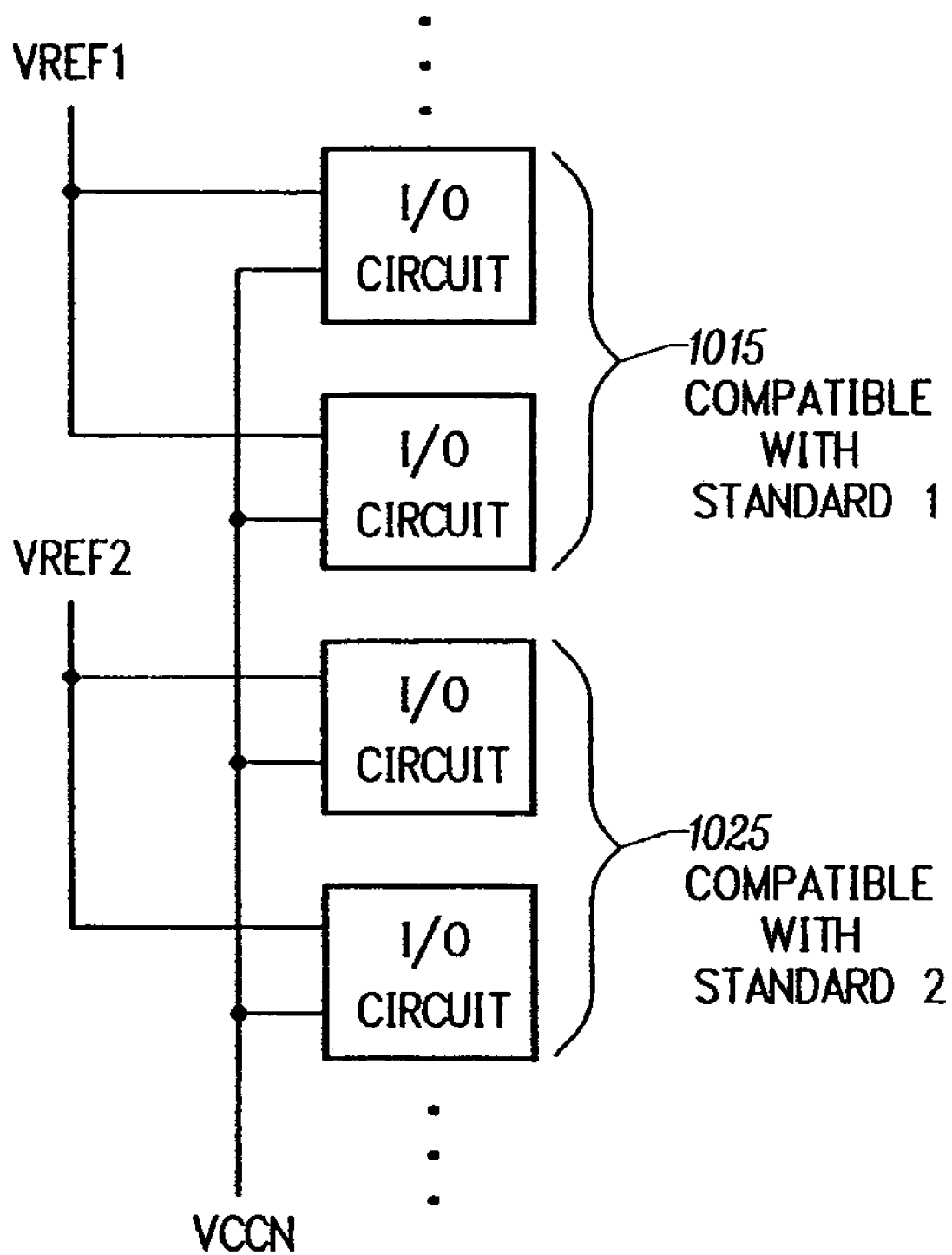
FIG. 10 shows I/O circuits of an integrated circuit connected to the same supply voltage and compatible with more than one different I/O standard.

FIG. 10 shows a number of I/O circuits of an integrated circuit. All of the I/O circuits are connected to the same supply voltage, VCCN. The supply voltage should be the highest supply voltage needed by any of the I/O standards. Two of the I/O circuits 1015 are connected to a first VREF voltage VREF1 and two of the I/O circuits 1025 are connected to a second VREF voltage VREF2. By using the I/O circuitry of the present invention such as shown in FIG. 6 or 7, I/O circuits 1015 will be compatible with a first I/O standard and I/O circuits 1025 will be compatible with a second I/O standard. The first and second I/O standards are different while a single supply voltage VCCN is supplied to all the I/O circuits. The circuitry of the present invention eliminates the need to use different supply voltages to be compatible with different I/O standards. Among the many advantages of this circuitry, this circuitry saves space on the integrated circuit.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An integrated circuit comprising:
   a plurality of first I/O circuits coupled to a supply voltage and a first reference voltage; and
   a plurality of second I/O circuits coupled to the supply voltage and a second reference voltage, wherein the first reference voltage is different from the second reference voltage and the plurality of first I/O circuits is compatible with a first I/O standard based on the first reference voltage and the plurality of second I/O circuits is compatible with a second I/O voltage standard based on the second reference voltage,
   wherein each of the I/O circuits comprise;
   a first register;
   an output buffer having an output coupled to a pad;
   a first multiplexing circuit configured to selectively couple an output of the first register to an input of the output buffer; and
   a second multiplexing circuit configured to selectively couple a first input of the first multiplexing circuit to an input of the first register.

2. The integrated circuit of claim 1 wherein each of the I/O circuits further comprise:
   a second register having an output coupled to a tristate control input of the output buffer.

3. The integrated circuit of claim 2 wherein each of the I/O circuits further comprise:
   a third multiplexing circuit configured to selectively couple one of a plurality of logic elements to an input of the second register.

4. The integrated circuit of claim 2 wherein each of the I/O circuits further comprise:
   a third multiplexing circuit configured to selectively couple a logic element to a first input of the second multiplexing circuit and the first input of the first multiplexing circuit.

5. The integrated circuit of claim 2 wherein each of the I/O circuits further comprise:
   a third multiplexing circuit configured to selectively couple one of a plurality of logic elements to a clock input of the first register.

6. The integrated circuit of claim 2 wherein each of the I/O circuits further comprise:
   a third multiplexing circuit configured to selectively couple a logic element to a first input of the second multiplexing circuit and the first input of the first multiplexing circuit; and
   a fourth multiplexing circuit configured to selectively couple one of a plurality of logic elements to an input of the second register.

7. The integrated circuit of claim 2 further comprising a delay line coupled between the first multiplexing circuit and the input of the output buffer.

8. An integrated circuit comprising:
   a plurality of first I/O circuits coupled to a supply voltage and a first reference voltage; and
   a plurality of second I/O circuits coupled to the supply voltage and a second reference voltage, wherein the first reference voltage is different from the second reference voltage and the plurality of first I/O circuits is compatible with a first I/O standard based on the first reference voltage and the plurality of second I/O circuits is compatible with a second I/O voltage standard based on the second reference voltage, wherein each of the I/O circuits comprise:

a first register;

an output buffer having an output coupled to a pad;

a first multiplexing circuit configured to selectively couple either an output of the first register or an input of the first register to an input of the output buffer;

a second register having an output coupled to a tristate control of the output buffer; and a second multiplexing circuit configured to selectively couple one of a plurality of logic elements to an input of the second register.

9. The integrated circuit of claim 8 wherein each of the I/O circuits further comprise:

a third multiplexing circuit configured to selectively couple a logic element to the input of the first register.

10. The integrated circuit of claim 8 wherein each of the I/O circuits further comprise:

a third multiplexing circuit configured to selectively couple one of a plurality of logic elements to a clock input of the first register.

11. The integrated circuit of claim 8 wherein each of the I/O circuits further comprise:

a third multiplexing circuit configured to selectively couple a logic element to the input of the first register, and a fourth multiplexing circuit configured to selectively couple one of a plurality of logic elements to a clock input of the first register.

12. The integrated circuit of claim 8 wherein each of the I/O circuits further comprise:

a programmable delay line coupled between the first multiplexing circuit and the output buffer.

13. An integrated circuit comprising:

a plurality of first I/O circuits coupled to a supply voltage and a first reference voltage; and a plurality of second I/O circuits coupled to the supply voltage and a second reference voltage, wherein the first reference voltage is different from the second reference voltage and the plurality of first I/O circuits is compatible with a first I/O standard based on the first reference voltage and the plurality of second I/O circuits is compatible with a second I/O voltage standard based on the second reference voltage, wherein each of the I/O circuits comprise:

a first register;

an output buffer having an output coupled to a pad;

a first multiplexing circuit configured to selectively couple either an output of the first register or an input of the first register to an input of the output buffer; and a second multiplexing circuit configured to selectively couple a logic element to the input of the first register.

14. The integrated circuit of claim 13 wherein each of the I/O circuits further comprise:

a second register having an output coupled to a tristate control of the output buffer.

15. The integrated circuit of claim 13 wherein each of the I/O circuits further comprise:

a third multiplexing circuit configured to selectively couple one of a plurality of logic elements to a clock input of the first register.

16. The integrated circuit of claim 13 wherein each of the I/O circuits further comprise:

a second register having an output coupled to a tristate control of the output buffer; and a third multiplexing circuit configured to selectively couple one of a plurality of logic elements to a clock input of the first register.

17. An integrated circuit comprising:

a plurality of first I/O circuits coupled to a supply voltage and a first reference voltage, and a plurality of second I/O circuits coupled to the supply voltage and a second reference voltage, wherein the first reference voltage is different from the second reference voltage and the plurality of first I/O circuits is compatible with a first I/O standard based on the first reference voltage and the plurality of second I/O circuits is compatible with a second I/O voltage standard based on the second reference voltage, wherein each of the I/O circuits comprise:

a first register;

an output buffer having an output coupled to a pad;

a first multiplexing circuit configured to selectively couple either an output of the first register or an input of the first register to an input of the output buffer; and a second multiplexing circuit configured to selectively couple one of a plurality of logic elements to a clock input of the first register.

18. The integrated circuit of claim 17 wherein each of the I/O circuits further comprise:

a second register having an output coupled to a tristate control of the output buffer.

\* \* \* \* \*